United States Patent
Ikeda

(10) Patent No.: US 10,643,689 B1
(45) Date of Patent: May 5, 2020

(54) CONTROL CIRCUIT AND CONTROL METHOD FOR PSEUDO STATIC RANDOM ACCESS MEMORY

(71) Applicant: Winbond Electronics Corp., Taichung (TW)

(72) Inventor: Hitoshi Ikeda, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/386,236

(22) Filed: Apr. 16, 2019

(51) Int. Cl.
  *G11C 11/419* (2006.01)
  *G11C 7/22* (2006.01)
  *G11C 11/412* (2006.01)

(52) U.S. Cl.
  CPC ............ *G11C 11/419* (2013.01); *G11C 7/222* (2013.01); *G11C 11/412* (2013.01)

(58) Field of Classification Search
  None
  See application file for complete search history.

(56) References Cited

U.S. PATENT DOCUMENTS

| 9,064,601 B2 | 6/2015 | Chen et al. |
| 2002/0126566 A1* | 9/2002 | Takeuchi ............. G11C 8/18 365/233.5 |

FOREIGN PATENT DOCUMENTS

| CN | 102981776 | 6/2015 |
| TW | I276111 | 3/2007 |

* cited by examiner

*Primary Examiner* — James G Norman
(74) *Attorney, Agent, or Firm* — JCIPRNET

(57) ABSTRACT

A control circuit and a control method for a pseudo static random access memory are provided. The control circuit counts a number of latch times of data based on an external clock to generate a first count value, counts a number of write times of the data based on an asynchronous column address strobe clock to generate a second count value, and compares the first count value and the second count value. The control circuit provides a column address strobe clock according to the asynchronous column address strobe clock in an asynchronous mode. At the time of a first occurrence of the first count value being equal to the second count value, the control circuit enters a write operation into a synchronous mode from the asynchronous mode to adjust a period of the asynchronous column address strobe clock to a period of the external clock.

18 Claims, 10 Drawing Sheets

CONTROL CIRCUIT AND CONTROL METHOD FOR PSEUDO STATIC RANDOM ACCESS MEMORY

BACKGROUND

Technical Field

The disclosure relates to a control circuit and a control method for a memory device, and more particularly, to a control circuit and a control method for a pseudo static random access memory.

Description of Related Art

In recent years, as the level of integration of semiconductor memory components advances, there is a need for higher speeds, and the static random access memory (SRAM) and the dynamic random access memory (DRAM) have been used as high-speed memories. The demand for the pseudo static random access memory (pSRAM), which has the advantages of the dynamic random access memory, continues to grow, especially in the applications to mobile devices.

In the pSRAM currently available, in the case where the clock period of the write operation is short, the writing of data may be synchronous or asynchronous. In order to avoid errors, in the write operation, in the case where the writing of data is asynchronous, a control path is established to provide a corresponding column address strobe (CAS) clock, and in the case where the writing of data is synchronous, a control path is established to provide another corresponding column address strobe clock. Accordingly, the pSRAM can execute the synchronous mode or the asynchronous mode of the write operation through different control paths.

However, in the above method, since the clock period is short, when the pSRAM switches from the asynchronous mode to the synchronous mode, it is possible that, due to the path change, after the control path is changed, a column address strobe clock cannot be timely generated in the first clock of the path change, which thus causes an error in the write operation.

SUMMARY

The disclosure provides a control circuit and a control method for a pseudo static random access memory (pSRAM), which can execute the synchronous mode and the asynchronous mode of the write operation without using multiple control paths in the write operation.

A control circuit of the disclosure is adapted for a pSRAM. The control circuit includes a first counter, a second counter, a comparator, an asynchronous controller, and a clock generator. The first counter is configured to count a number of latch times of data written to the pSRAM based on an external clock to generate a first count value. The second counter is configured to count a number of write times of the data written to the pSRAM based on an asynchronous column address strobe clock to generate a second count value. An initial period of the asynchronous column address strobe clock is less than a period of the external clock. The comparator is coupled to the first counter and the second counter. The comparator is configured to compare the first count value and the second count value. The comparator provides a mode signal at a first logic level when the first count value is equal to the second count value. The asynchronous controller is coupled to the comparator and the second counter. The asynchronous controller is configured to receive the mode signal and a column address strobe clock in a write operation, and provide the asynchronous column address strobe clock according to the column address strobe clock in an asynchronous mode. When the asynchronous controller receives the mode signal at the first logic level for a first time, the asynchronous controller enters the write operation into a synchronous mode from the asynchronous mode to adjust the period of the asynchronous column address strobe clock to the period of the external clock. The clock generator is coupled to the asynchronous controller. The clock generator is configured to provide the column address strobe clock according to the asynchronous column address strobe clock.

A control method of the disclosure is adapted for a pSRAM. The control method includes the following steps. A number of latch times of data written to the pSRAM is counted based on an external clock to generate a first count value. An asynchronous column address strobe clock is provided according to a column address strobe clock in an asynchronous mode. A number of write times of the data written to the pSRAM is counted based on the asynchronous column address strobe clock to generate a second count value, wherein an initial period of the asynchronous column address strobe clock is less than a period of the external clock. The first count value and the second count value are compared, and a mode signal at a first logic level is provided when the first count value is equal to the second count value. When the mode signal at the first logic level is received for a first time, a write operation is entered into a synchronous mode from the asynchronous mode to adjust the period of the asynchronous column address strobe clock to the period of the external clock. The column address strobe clock is provided according to the asynchronous column address strobe clock.

Based on the above, the control circuit of the disclosure counts a number of latch times of the data based on the external clock to generate the first count value, counts a number of write times of the data based on the asynchronous column address strobe clock to generate the second count value, and compares the first count value and the second count value. The control circuit provides the asynchronous column address strobe clock according to the column address strobe clock in the asynchronous mode to provide the column address strobe clock. At the time of the first occurrence of the first count value being equal to the second count value, the control circuit enters the write operation into the synchronous mode from the asynchronous mode to adjust the period of the asynchronous column address strobe clock to the period of the external clock to provide the column address strobe clock. Accordingly, in the write operation, the disclosure can execute the synchronous mode and the asynchronous mode of the write operation without using multiple control paths.

To make the aforementioned more comprehensible, several embodiments accompanied with drawings are described in detail as follows.

DESCRIPTION OF THE EMBODIMENTS

Figure 1:
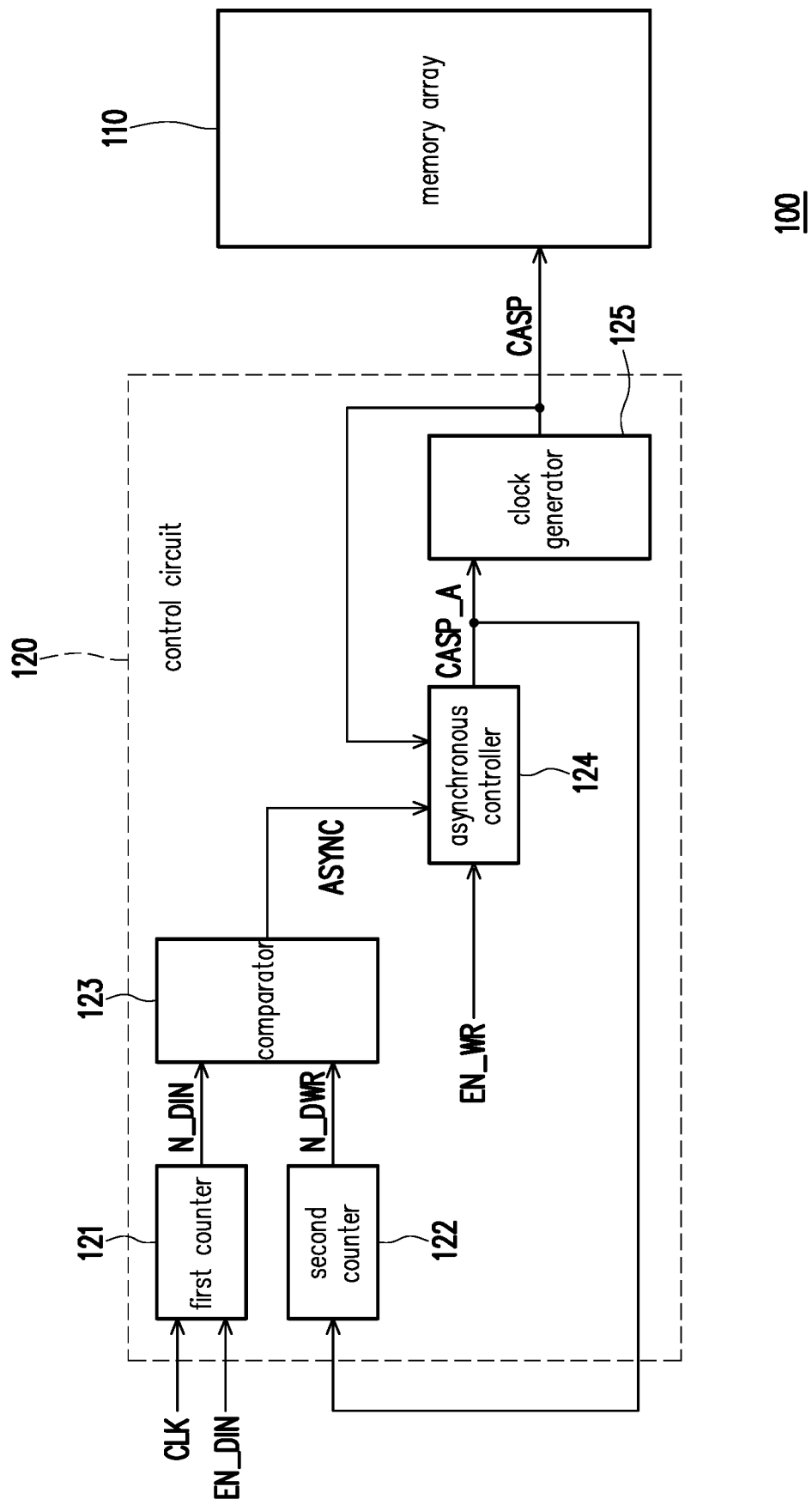
FIG. 1 is a circuit diagram of a pSRAM according to a first embodiment of the disclosure.

Referring to FIG. 1, FIG. 1 is a circuit diagram of a pseudo static random access memory (hereinafter pSRAM) according to a first embodiment of the disclosure. In the present embodiment, a pSRAM 100 includes a memory array 110 and a control circuit 120. The control circuit 120 is configured to provide a column address strobe clock CASP to control a write operation of the memory array 110. The control circuit 120 includes a first counter 121, a second counter 122, a comparator 123, an asynchronous controller 124, and a clock generator 125. For example, the pSRAM 100 further includes peripheral circuits such as an input and output circuit and a data latch. The first counter 121 is configured to count a number of latch times of data written to the pSRAM 100 based on an external clock to generate a first count value N_DIN. The first counter 121 may count a number of latch times of the data of the data latch based on an external clock CLK to generate the first count value N_DIN. Once a data latch latches data, the first counter 121 increments the first count value N_DIN according to an input indication signal EN_DIN. The input indication signal EN_DIN is a status signal for indicating inputting the data. The second counter 122 is configured to count a number of write times of the data written to the pSRAM 100 based on an asynchronous column address strobe clock CASP_A to generate a second count value N_DWR. The second counter 122 may count a number of times of writing the data to the memory array 110 based on the asynchronous column address strobe clock CASP_A to generate the second count value N_DWR. Once data is written to the memory array 110, the second counter 122 increments the second count value N_DWR according to a write indication signal EN_WR. The write indication signal EN_WR is a status signal for indicating performing the write operation. The initial period of the asynchronous column address strobe clock CASP_A is less than the period of the external clock CLK. In other words, in the write operation, the speed at which data is written to the memory array 110 is higher than the latch speed of the data. Therefore, the incremental speed of the second count value N_DWR will be higher than the incremental speed of the first count value N_DIN.

The comparator 123 is coupled to the first counter 121 and the second counter 122. The comparator 123 compares the first count value N_DIN and the second count value N_DWR to determine whether the first count value N_DIN and the second count value N_DWR are equal to each other. When the comparator 123 determines that the first count value N_DIN is equal to the second count value N_DWR, the comparator 123 provides a mode signal ASYNC at a first logic level. On the other hand, when the comparator 123 determines that the first count value N_DIN is not equal to the second count value N_DWR, the comparator 123 provides a mode signal ASYNC at a second logic level.

The asynchronous controller 124 is coupled to the comparator 123 and the second counter 122. The asynchronous controller 124 is configured to receive the mode signal ASYNC at the first logic level and the column address strobe clock CASP in the write operation and provide the asynchronous column address strobe clock CASP_A according to the column address strobe clock CASP in an asynchronous mode. When the asynchronous controller 124 receives the mode signal ASYNC at the first logic level for the first time, the write operation is entered into a synchronous mode from the asynchronous mode to adjust the period of the asynchronous column address strobe clock CASP_A to the period of the external clock. The clock generator 125 is coupled to the asynchronous controller 124. The clock generator 125 is configured to provide the column address strobe clock CASP according to the asynchronous column address strobe clock CASP_A.

Figure 2:
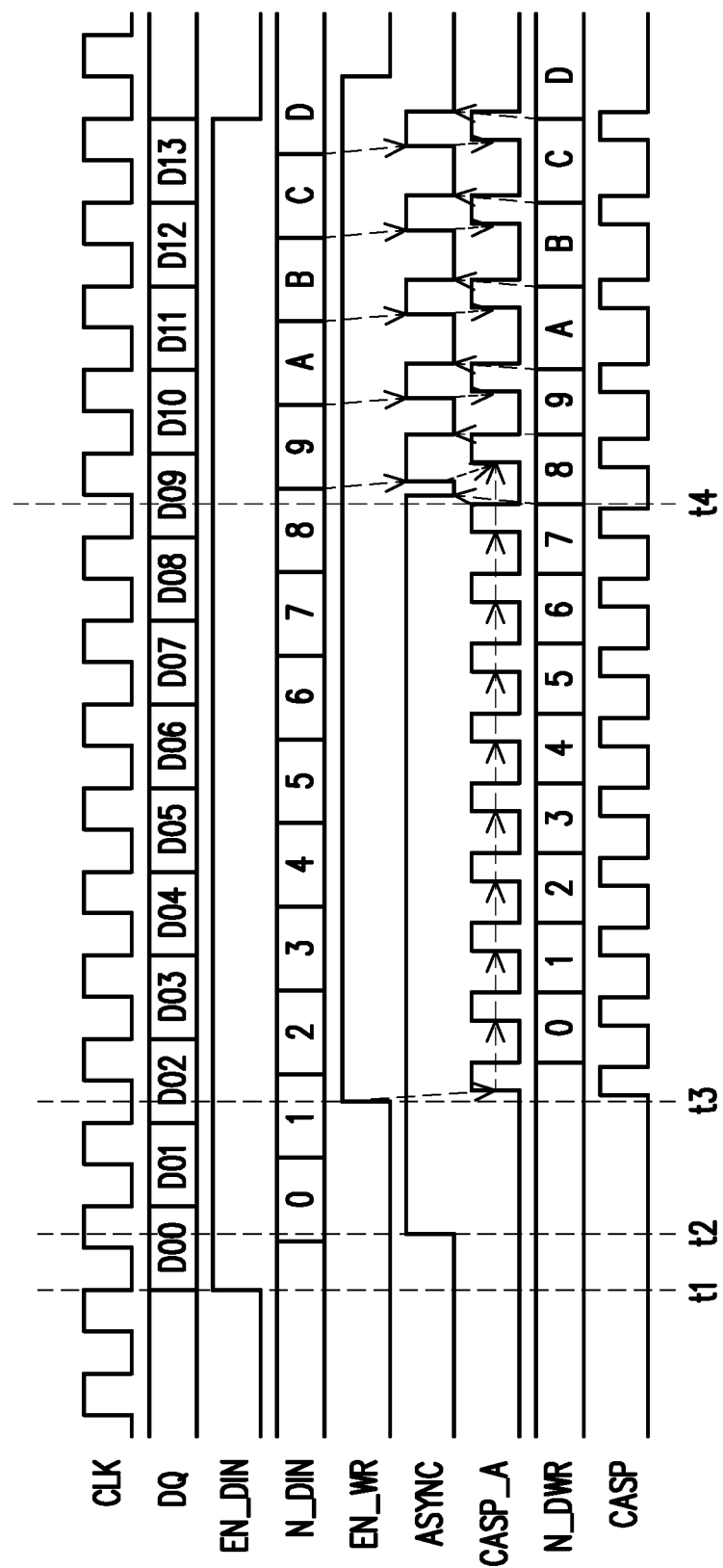
FIG. 2 is a timing chart of a write operation according to the first embodiment.

Specifically, referring to FIG. 1 and FIG. 2 at the same time, FIG. 2 is a timing chart of a write operation according to the first embodiment. In the present embodiment, at time point t1, data DQ starts to be input. Moreover, the input indication signal EN_DIN for indicating inputting the data DQ transitions from a low logic level to a high logic level. At time point t2, a first data D00 starts to be latched, and the first counter 121 starts to count a number of times the data DQ is latched based on the external clock CLK to generate the first count value N_DIN of "0". At this time, since the second count value N_DWR has not been generated, the first count value N_DIN is different from the second count value N_DWR. Therefore, the comparator 123 starts to provide the mode signal ASYNC at a second logic level (i.e., the high logic level) at time point t2. Next, at time point t3, the write operation is started. The write indication signal EN_WR for indicating performing the write operation transitions from the low logic level to the high logic level. At time point t3, the asynchronous controller 124 starts to provide the asynchronous column address strobe clock CASP_A when going into the write operation. Since the initial period of the asynchronous column address strobe clock CASP_A is less than the period of the external clock CLK, the control circuit 120 enters the asynchronous mode of the write operation. The second counter 122 starts to count the number of the write times of the data written to the pSRAM 100 based on the asynchronous column address strobe clock CASP_A to generate the second count value N_DWR of "0". In addition, the clock generator 125 provides the column address strobe clock CASP according to the asynchronous column address strobe clock CASP_A. Next, the first counter 121 and the second counter 122 continue to count. Since the incremental speed of the second count value N_DWR is higher than the incremental speed of the first count value N_DIN, at time point t4, the second count value N_DWR is equal to the first count value N_DIN (N_DWR=N_DIN=8). This means that at time point t4, the previously latched data D00 to D08 are all written. The comparator 123 provides the mode signal ASYNC at the first logic level (i.e., the low logic level). It is noted that it is when the asynchronous controller 124 receives the mode signal ASYNC at the first logic level in the write operation (the write indication signal EN_WR is at the high logic level) for the first time that the write operation is entered into the synchronous mode from the asynchronous mode. According to the mode signal ASYNC at the first logic level, the asynchronous controller 124 does not provide the asynchronous column address strobe clock CASP_A. Later, when the first count value N_DIN is equal to 9 and the second count value N_DWR is equal to 8, the mode signal ASYNC transitions from the first logic level to the second logic level. At this time, the asynchronous controller 124 provides the asynchronous column address strobe clock CASP_A. Accordingly, the period of the asynchronous column address strobe clock CASP_A is gradually adjusted to the period of the external clock CLK to achieve the effect of synchronizing the synchronous column address strobe clock CASP_A and the external clock CLK. After time point t4, the latching and writing of data D09 to D13 are synchronous until the pSRAM changes to a standby state.

It is noted that the control circuit 120 provides the asynchronous column address strobe clock CASP_A according to the column address strobe clock CASP in the asynchronous mode to provide the column address strobe clock CASP. At the time of a first occurrence of the first count value N_DIN being equal to the second count value N_DWR, the control circuit 120 enters the write operation into the synchronous mode from the asynchronous mode to adjust the period of the asynchronous column address strobe clock CASP_A to the period of the external clock to provide the column address strobe clock CASP. Accordingly, in the write operation, the disclosure can execute the synchronous mode and the asynchronous mode of the write operation without using multiple control paths.

Figure 3:
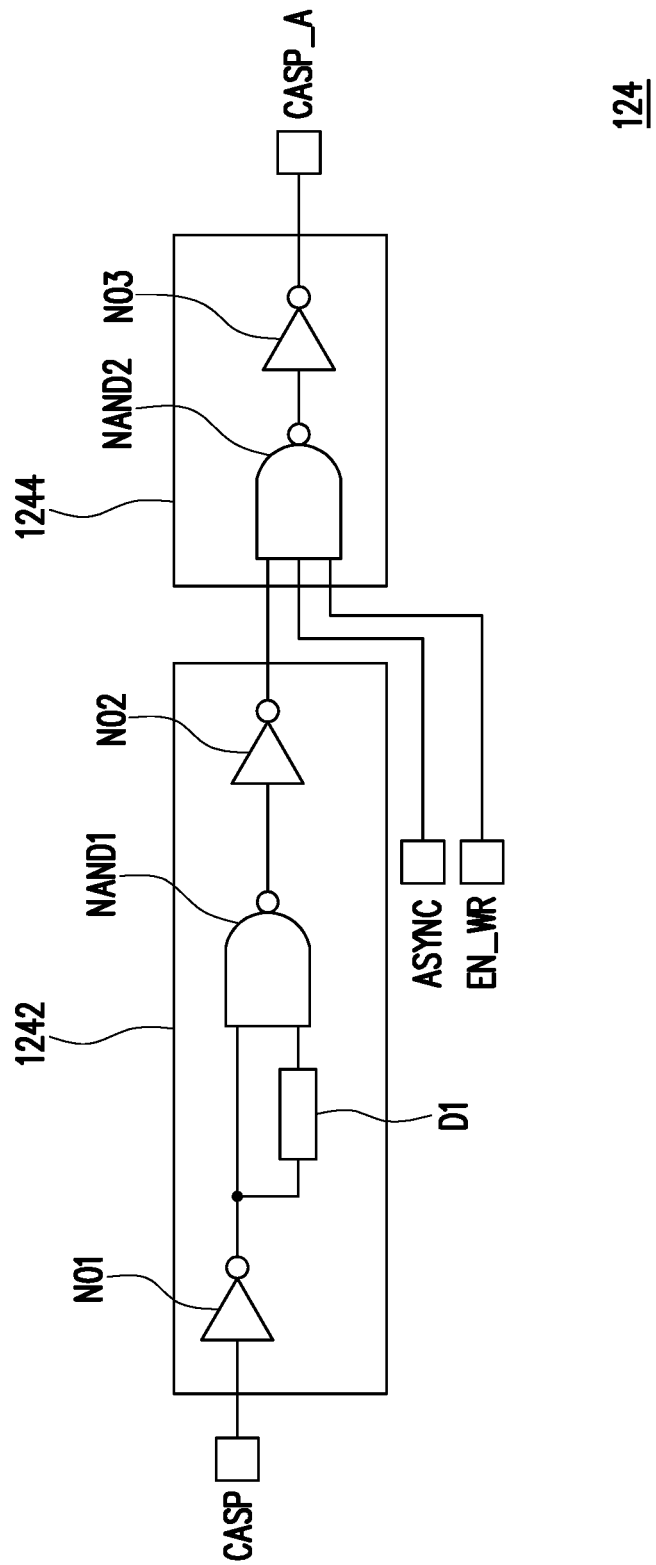
FIG. 3 is a circuit diagram of the asynchronous controller according to the first embodiment.

Next, the implementation details of the asynchronous controller will be described. Referring to FIG. 1 and FIG. 3 at the same time, FIG. 3 is a circuit diagram of the asynchronous controller according to the first embodiment. In the present embodiment, the asynchronous controller 124 includes a timing adjuster 1242 and an asynchronous determiner 1244. The timing adjuster 1242 is coupled to the clock generator 125. The timing adjuster 1242 is configured to receive the column address strobe clock CASP and adjust the time length of the low logic level of the asynchronous column address strobe clock CASP_A based on the column address strobe clock CASP. The asynchronous determiner 1244 is coupled to the timing adjuster 1242 and the clock generator 125. The asynchronous determiner 1244 is configured to provide the asynchronous column address strobe clock CASP_A when receiving the mode signal ASYNC at the second logic level and the write indication signal EN_WR corresponding to entering the write operation.

In the present embodiment, the timing adjuster 1242 includes inverters N01 and N02, a delayer D1, and a NAND gate NAND1. The input terminal of the inverter N01 is coupled to the clock generator 125 to receive the column address strobe clock CASP. The input terminal of the delayer D1 is coupled to the output terminal of the inverter N01. The first input terminal of the NAND gate NAND1 is coupled to the output terminal of the inverter N01, and the second input terminal of the NAND gate NAND1 is coupled to the output terminal of the delayer D1. The input terminal of the inverter N02 is coupled to the output terminal of the NAND gate NAND1, and the output terminal of the inverter N02 is coupled to the asynchronous determiner 1244. The output terminal of the inverter N02 is configured to output the asynchronous column address strobe clock CASP_A. In the present embodiment, the timing adjuster 1242 may determine the time length of the low logic level of the asynchronous column address strobe clock CASP_A through the time delay setting of the delayer D1.

The asynchronous determiner 1244 includes a NAND gate NAND2 and an inverter N03. The first input terminal of the NAND gate NAND2 is coupled to the inverter N02 of the timing adjuster 1242. The second input terminal of the NAND gate NAND2 is configured to receive the mode signal ASYNC. The third input terminal of the NAND gate NAND2 is configured to receive the write indication signal EN_WR. The input terminal of the inverter N03 is coupled to the output terminal of the NAND gate NAND2. The output terminal of the inverter N03 is configured to provide the asynchronous column address strobe clock CASP_A. The asynchronous determiner 1244 provides the asynchronous column address strobe clock CASP_A when receiving the write indication signal EN_WR at the high logic level and the mode signal ASYNC at the high logic level.

Figure 4:
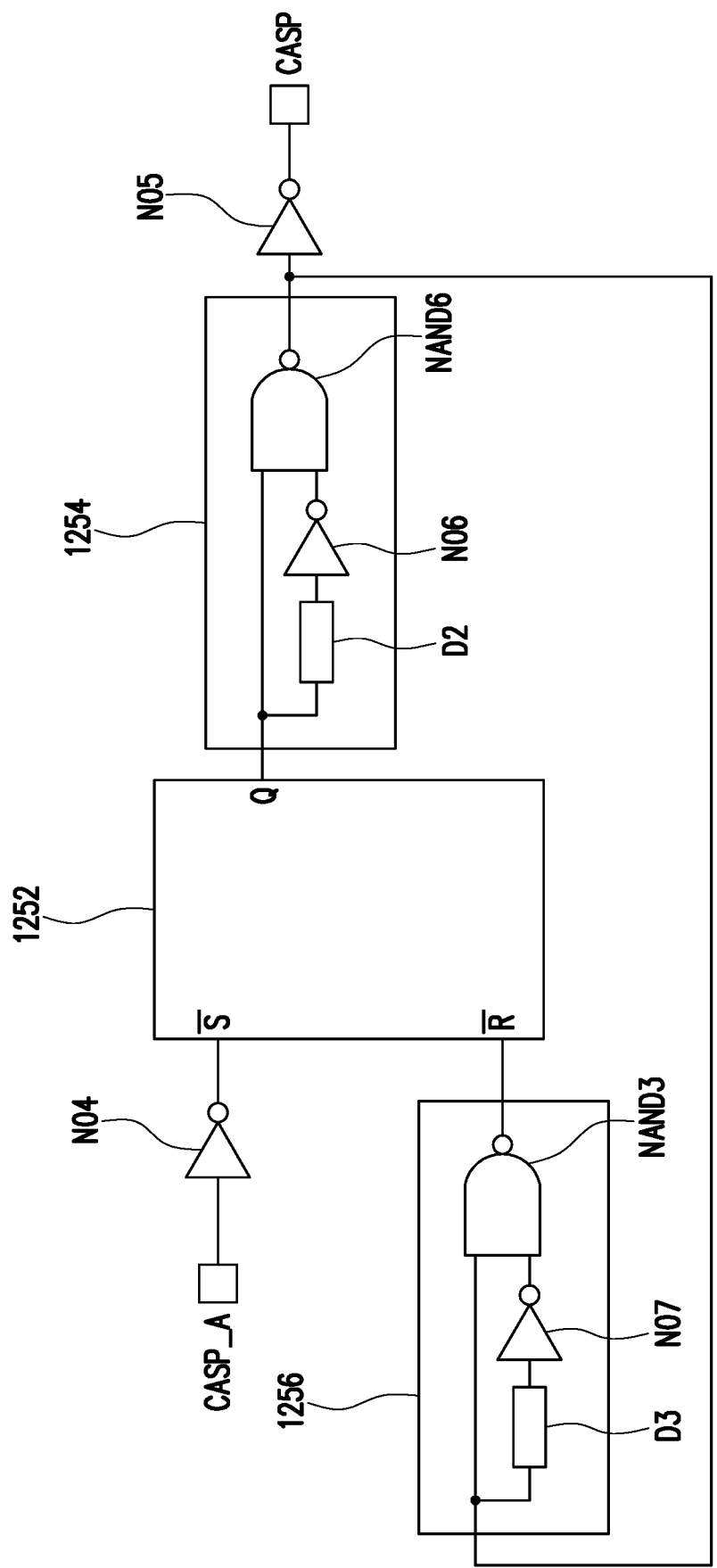
FIG. 4 is a circuit diagram of the clock generator according to the first embodiment.

Next, the implementation details of the clock generator will be described. Referring to FIG. 1, FIG. 3, and FIG. 4 at the same time, FIG. 4 is a circuit diagram of the clock generator according to the first embodiment. In the present embodiment, the clock generator 125 includes inverters N04 and N05, a flip-flop 1252, and timing adjusters 1254 and 1256. The input terminal of the inverter N04 is coupled to the asynchronous controller 124 to receive the asynchronous column address strobe clock CASP_A. A set input terminal/S of the flip-flop 1252 is coupled to the output terminal of the inverter N04. The input terminal of the timing adjuster 1254 is coupled to an output terminal Q of the flip-flop 1252. The input terminal of the inverter N05 is coupled to the output terminal of the timing adjuster 1254. The output terminal of the inverter N05 is configured to provide the column address strobe clock CASP. The input terminal of the timing adjuster 1256 is coupled to the output terminal of the timing adjuster 1254. The output terminal of the timing adjuster 1256 is coupled to a reset input terminal/R of the flip-flop 1252. The timing adjuster 1256 may adjust the reset timing of the flip-flop 1252 based on the column address strobe clock CASP. The flip-flop 1252 of the present embodiment may be, for example, a set-reset latch composed of multiple NAND gates, and the disclosure is not limited thereto.

Specifically, the timing adjuster 1254 includes a delayer D2, an inverter N06, and a NAND gate NAND6. The input terminal of the delayer D2 is coupled to the output terminal Q of the flip-flop 1252. The input terminal of the inverter N06 is coupled to the output terminal of the delayer D2. The first input terminal of the NAND gate NAND6 is coupled to the output terminal Q of the flip-flop 1252. The second input terminal of the NAND gate NAND6 is coupled to the output terminal of the inverter N06. The output terminal of the NAND gate NAND6 is coupled to the input terminal of the inverter N05.

In the present embodiment, with the coordination of the asynchronous controller 124 and the clock generator 125, the timing adjuster 1254 can determine the time length of the high logic level (i.e., the pulse width) of the asynchronous column address strobe clock CASP_A through the time delay setting of the delayer D2. In addition, in the timing adjuster 1242 of the asynchronous controller 124, the time delay setting of the delayer D1 also indirectly determines the time length of the low logic level of the column address strobe clock CASP.

The timing adjuster 1256 includes a delayer D3, an inverter N07, and a NAND gate NAND3. The input terminal of the delayer D3 is coupled to the output terminal of the timing adjuster 1254. The input terminal of the inverter N07 is coupled to the output terminal of the delayer D3. The first input terminal of the NAND gate NAND3 is coupled to the output terminal of the timing adjuster 1254. The second input terminal of the NAND gate NAND3 is coupled to the output terminal of the inverter N07. The output terminal of the NAND gate NAND3 is coupled to the reset input terminal/R of the flip-flop 1252. In the present embodiment, the timing adjuster 1256 may be regarded as resetting the flip-flop 1252 at the time point of the falling edge of the column address strobe clock CASP.

The time length of the low logic level of the column address strobe clock CASP may be associated with the time length of performing precharging on the data bus of the pSRAM. Therefore, the suitable time length for precharging may be determined through the time delay setting of the delayer D1 inside the asynchronous controller 124. The time length of the high logic level of the column address strobe clock CASP may be associated with the time length required for the data reading/the write operation of the memory cell. Therefore, the suitable read/write time may be determined through the time delay setting of the delayer D2 inside the clock generator 125.

Figure 5:
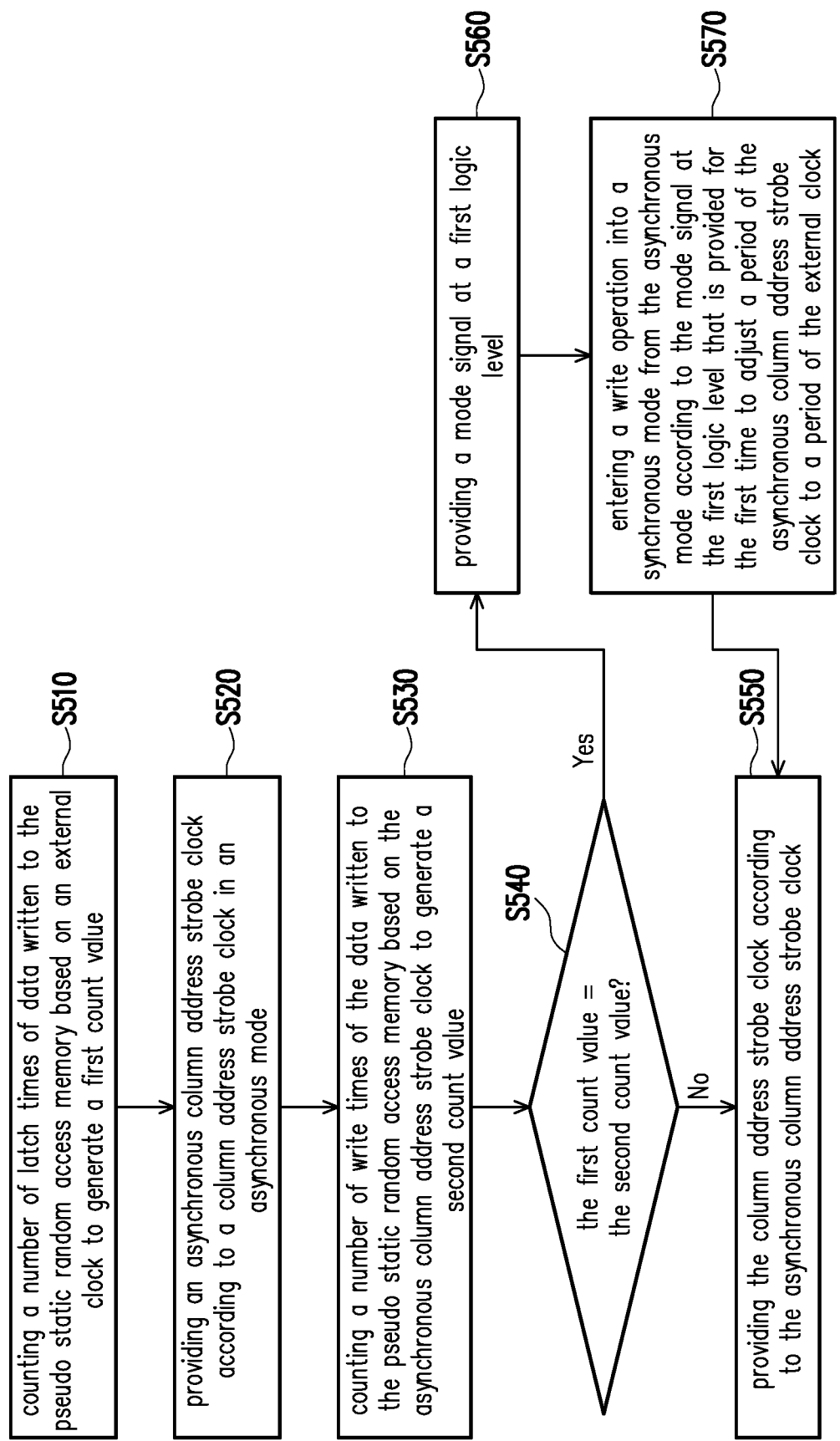
FIG. 5 is a flowchart of a control method according to the first embodiment.

Referring to FIG. 1 and FIG. 5 at the same time, FIG. 5 is a flowchart of a control method according to the first embodiment. In the present embodiment, in step S510, the control circuit 120 counts a number of latch times of data written to the pSRAM 100 based on an external clock CLK to generate a first count value N_DIN. In step S520, after the first count value N_DIN is generated, the control circuit 120 provides an asynchronous column address strobe clock CASP_A according to a column address strobe clock CASP in an asynchronous mode. In step S530, the control circuit 120 counts a number of write times of the data written to the pSRAM based on the asynchronous column address strobe clock CASP_A to generate a second count value N_DWR. In step S540, the control circuit 120 compares the first count value N_DIN and the second count value N_DWR. In step S540, the control circuit 120 determines whether the first count value N_DIN is equal to the second count value N_DWR. If the control circuit 120 determines that the first count value N_DIN is not equal to the second count value N_DWR, the asynchronous mode is maintained, and proceeding to step S550. In step S550, the control circuit 120 provides the column address strobe clock CASP according to the asynchronous column address strobe clock CASP_A. In step S540, if the control circuit 120 determines that the first count value N_DIN is equal to the second count value N_DWR, proceeding to step S560, a mode signal ASYNC at a first logic level is provided, and proceeding to step S570. In step S570, the control circuit 120 enters a write operation into a synchronous mode from the asynchronous mode according to the mode signal ASYNC at the first logic level that is provided for the first time to adjust a period of the asynchronous column address strobe clock CASP_A to a period of the external clock, and proceeding to step S550. The implementation details of steps S510 to S570 have been described in the description of the above embodiment and shall not be repeatedly described here.

Figure 6:
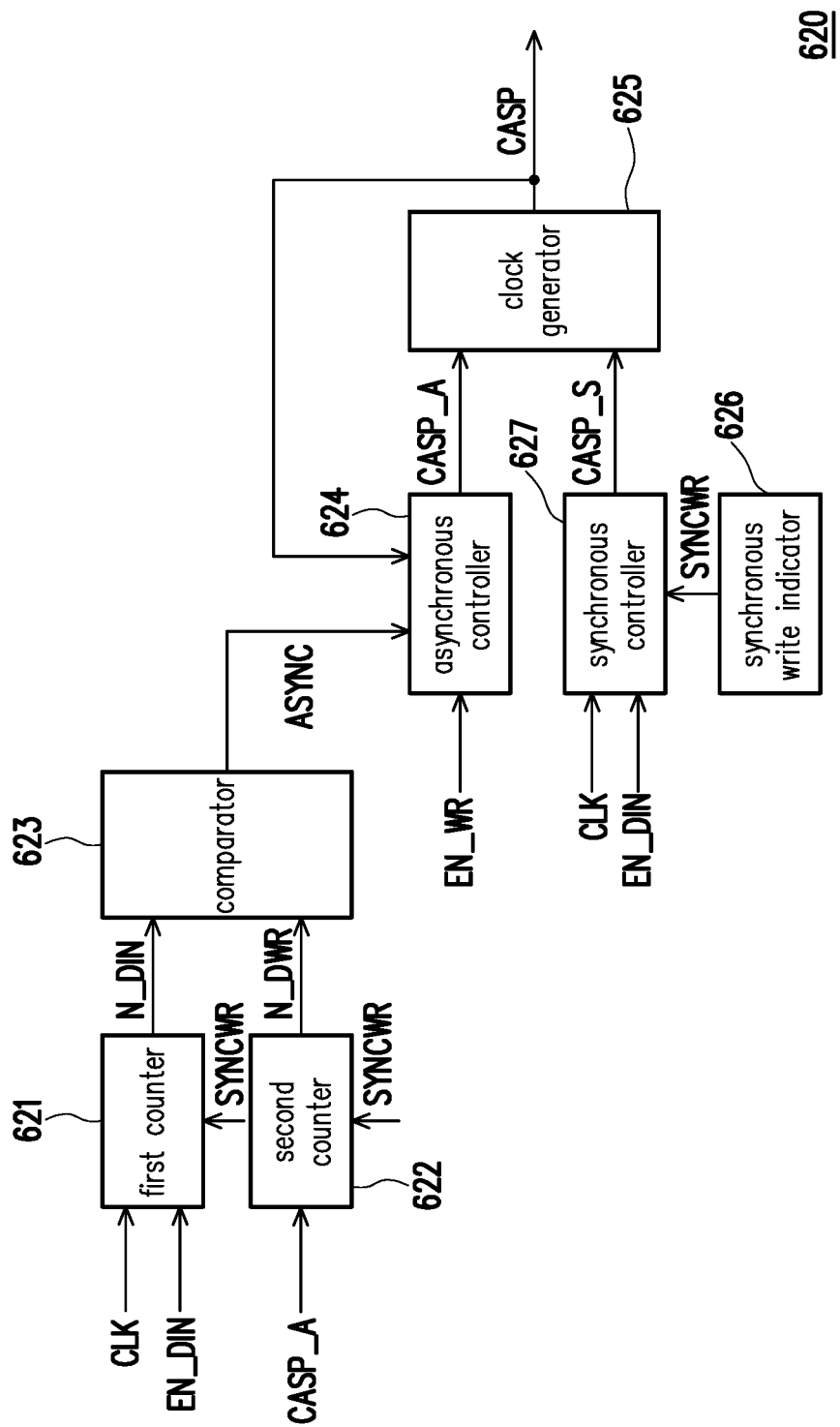
FIG. 6 is a circuit diagram of a control circuit according to a second embodiment of the disclosure.

Referring to FIG. 6, FIG. 6 is a circuit diagram of a control circuit according to a second embodiment of the disclosure. In the present embodiment, a control circuit 620 is configured to provide a column address strobe clock CASP to control a write operation of a memory array (not shown) of a pSRAM. The control circuit 620 includes a first counter 621, a second counter 622, a comparator 623, an asynchronous controller 624, a clock generator 625, a synchronous write indicator 626, and a synchronous controller 627. The implementation details of the coordination between the first counter 621, the second counter 622, the comparator 623, and the asynchronous controller 624 may be sufficiently taught in the first embodiment and shall not be repeatedly described here. In the present embodiment, the synchronous write indicator 626 is configured to determine whether a first initial time point of performing the write operation in the pSRAM is earlier than a second initial time point of latching the data written to the pSRAM. When the synchronous write indicator 626 determines that the first initial time point is earlier than the second initial time point, the synchronous write indicator 626 provides a synchronous write indication signal SYNCWR. On the other hand, when the synchronous write indicator 626 determines that the first initial time point is later than or equal to the second initial time point, the synchronous write indicator 626 does not provide the synchronous write indication signal SYNCWR. The synchronous controller 627 is coupled to the synchronous write indicator 626 and the clock generator 625. The synchronous controller 627 is configured to be enabled according to the synchronous write indication signal SYNCWR to provide a synchronous column address strobe clock CASP_S based on the external clock CLK. When the clock generator 625 receives the synchronous column address strobe clock CASP_S, the clock generator 625 provides the column address strobe clock CASP according to the synchronous column address strobe clock CASP_S.

Figure 7:
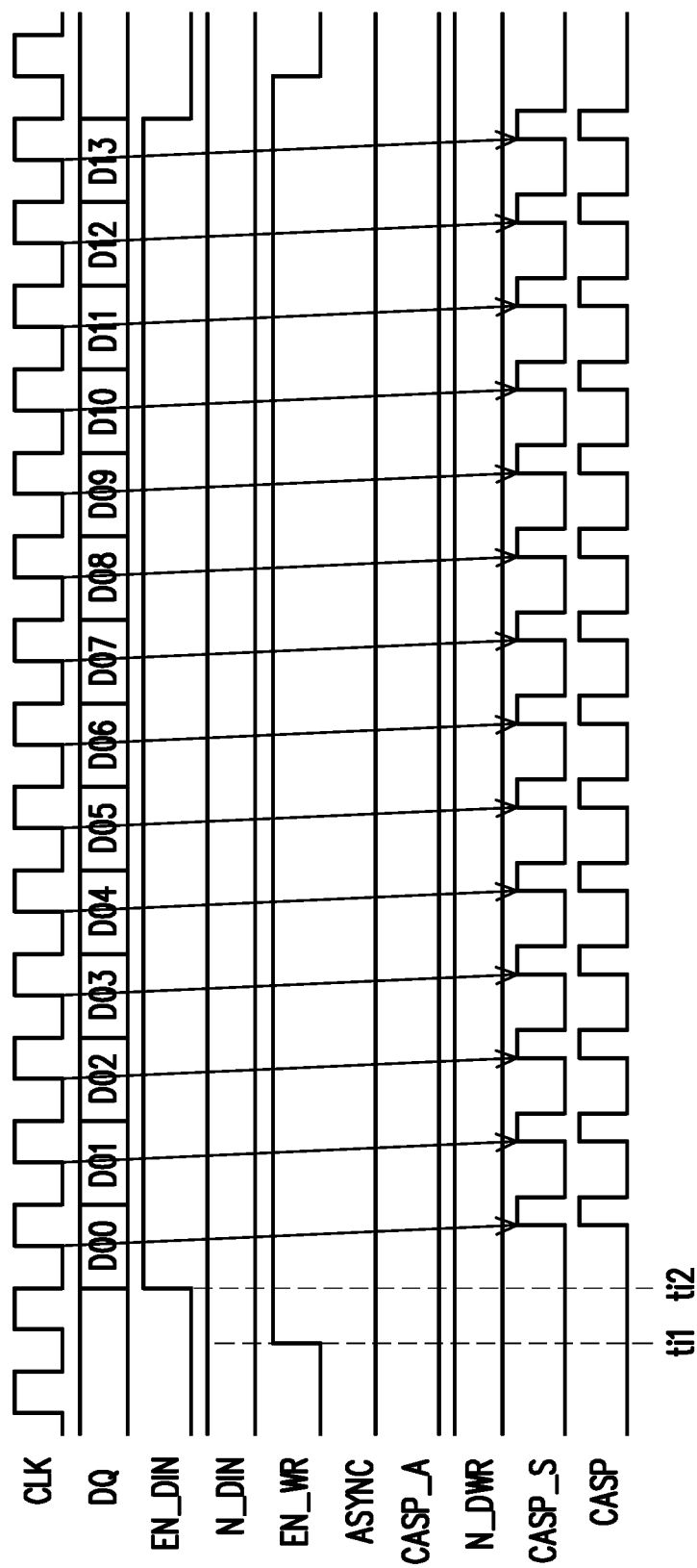
FIG. 7 is a timing chart of a write operation according to the second embodiment.

Specifically, referring to FIG. 6 and FIG. 7 at the same time, FIG. 7 is a timing chart of a write operation according to the second embodiment. In the present embodiment, the first initial time point is time point ti1 at which the write indication signal EN_WR for indicating performing the write operation transitions from the low logic level to the high logic level for the first time. The second initial time point is time point ti2 at which the input indication signal EN_DIN for indicating inputting the data DQ transitions from the low logic level to the high logic level for the first time. When the synchronous write indicator 626 determines that the first initial time point (time point ti1) is earlier than the second initial time point (time point ti2), the synchronous write indicator 626 provides the synchronous write indication signal SYNCWR. In the present embodiment, the synchronous write indicator 626 is further coupled to the first counter 621 and the second counter 622. In the case where time point ti1 is earlier than time point ti2, the first counter 621 is disabled according to the synchronous write indication signal SYNCWR to stop providing the first count value N_DIN, and the second counter 622 is disabled according to the synchronous write indication signal SYNCWR to stop providing the second count value N_DWR. Therefore, the comparator 623 does not provide the mode signal ASYNC at the second logic level. This makes the asynchronous controller 624 unable to provide the asynchronous column address strobe clock CASP_A. In addition, the synchronous controller 627 is enabled according to the synchronous write indication signal SYNCWR to provide the synchronous column address strobe clock CASP_S to generate the column address strobe clock CASP. The period of the synchronous column address strobe clock CASP_S is equal to the period of the external clock CLK.

On the other hand, when the synchronous write indicator 626 determines that the first initial time point (time point ti1) is earlier than the second initial time point (time point ti2), the synchronous write indicator 626 does not provide the synchronous write indication signal SYNCWR. In the case where the synchronous write indication signal SYNCWR is not provided, the first counter 621 may provide the first count value N_DIN, the second counter 622 may provide the second count value N_DWR, and the synchronous controller 627 is disabled. The implementation details in the case where the synchronous write indication signal SYNCWR is not provided may be sufficiently taught in the embodiment of FIG. 1 to FIG. 5 and shall not be repeatedly described here.

It is noted that the control circuit 620 of the second embodiment may further determine whether the time point at which the data DQ starts to be written is earlier than the time point at which the data DQ starts to be latched according to the first initial time point and the second initial time point. If the time point at which the data DQ starts to be written is earlier than the time point at which the data DQ is latched, the control circuit 620 provides the synchronous column address strobe clock CASP_S and provides the column address strobe clock CASP according to the synchronous column address strobe clock CASP_S. Accordingly, the timing at which the data DQ is latched is synchronized with the timing at which the data DQ is written, and the case where the timing at which the data DQ is latched does not catch up with the timing at which the data DQ is written does not occur.

Figure 8:
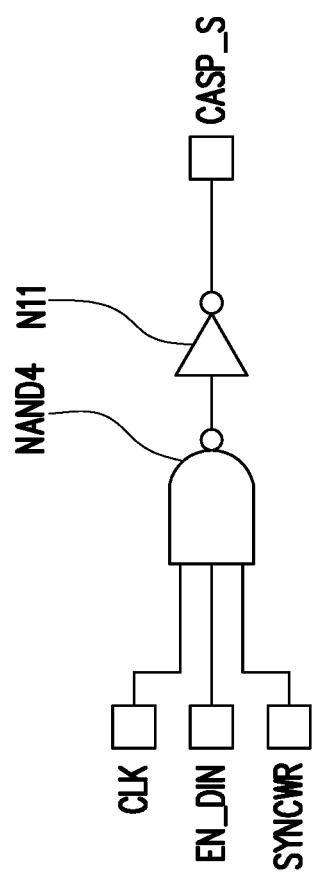
FIG. 8 is a circuit diagram of the synchronous controller according to the second embodiment.

Next, the implementation details of the synchronous controller will be described. Referring to FIG. 6 and FIG. 8 at the same time, FIG. 8 is a circuit diagram of the synchronous controller according to the second embodiment. In the present embodiment, the synchronous controller 627 includes a NAND gate NAND4 and an inverter N11. The first input terminal of the NAND gate NAND4 is configured to receive the external clock CLK. The second input terminal of the NAND gate NAND4 is configured to receive the input indication signal EN_DIN. The third input terminal of the NAND gate NAND4 is configured to receive the synchronous write indication signal SYNCWR provided by the synchronous write indicator 626. The input terminal of the inverter N11 is coupled to the output terminal of the NAND gate NAND4. The output terminal of the inverter N11 is configured to provide the synchronous column address strobe clock CASP_S to the clock generator 625.

Figure 9:
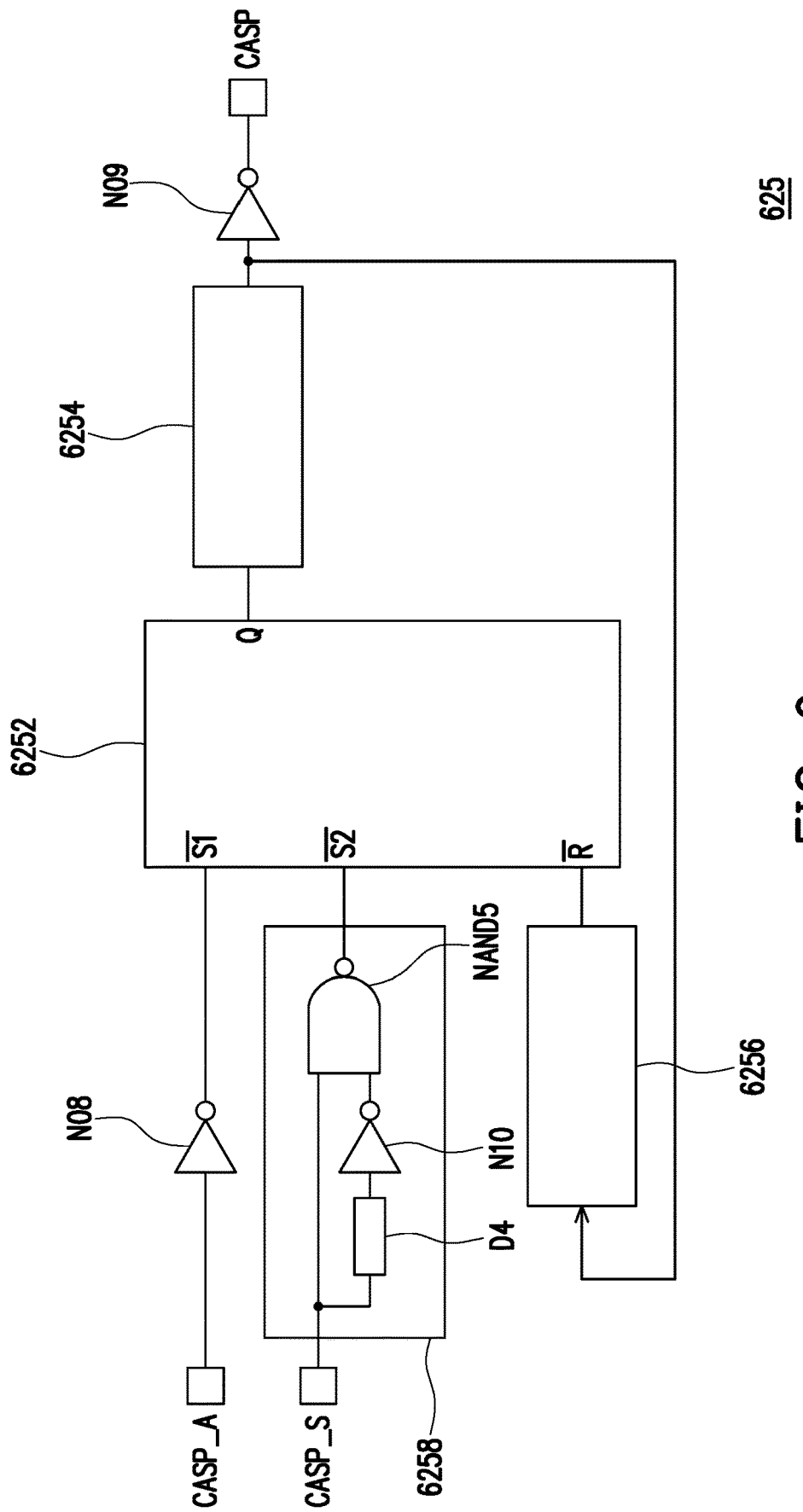
FIG. 9 is a circuit diagram of the clock generator according to the second embodiment.

Next, the implementation details of the clock generator will be described. Referring to FIG. 6 and FIG. 9 at the same time, FIG. 9 is a circuit diagram of the clock generator according to the second embodiment. In the present embodiment, the clock generator 625 includes inverters N08 and N09, a flip-flop 6252, and timing adjusters 6254, 6256, and 6258. The input terminal of the inverter N08 is coupled to the asynchronous controller 624 to receive the asynchronous column address strobe clock CASP_A. A first set input terminal/S1 of the flip-flop 6252 is coupled to the output terminal of the inverter N08. The input terminal of the timing adjuster 6254 is coupled to an output terminal Q of the flip-flop 6252. The timing adjuster 6254 may be the same as the timing adjuster 1254 of FIG. 4 or may be a simple modification of the timing adjuster 1254 of FIG. 4. The input terminal of the inverter N09 is coupled to the output terminal of the timing adjuster 6254. The output terminal of the inverter N09 is configured to provide the column address strobe clock CASP. The input terminal of the timing adjuster 6256 is coupled to the output terminal of the timing adjuster 6254. The output terminal of the timing adjuster 6256 is coupled to a reset input terminal/R of the flip-flop 6252. The timing adjuster 6256 may be the same as the timing adjuster 1256 of FIG. 4 or may be a simple modification of the timing adjuster 1256 of FIG. 4. The timing adjuster 6256 may adjust the reset timing of the flip-flop 6252 based on the column address strobe clock CASP. The input terminal of the timing adjuster 6258 is coupled to the synchronous controller 627 to receive the synchronous column address strobe clock CASP_S. The output terminal of the timing adjuster 6258 is coupled to a second set input terminal/S2 of the flip-flop 6252. The flip-flop 6252 of the present embodiment may be, for example, a set-reset latch composed of multiple NAND gates, and the disclosure is not limited thereto.

The timing adjuster 6258 includes a delayer D4, an inverter N10, and a NAND gate NAND5. The input terminal of the delayer D4 is coupled to the synchronous controller 627 to receive the synchronous column address strobe clock CASP_S. The input terminal of the inverter N10 is coupled to the output terminal of the delayer D4. The first input terminal of the NAND gate NAND5 is coupled to the synchronous controller 627 to receive the synchronous column address strobe clock CASP_S. The second input terminal of the NAND gate NAND5 is coupled to the output terminal of the inverter N10. The output terminal of the NAND gate NAND5 is coupled to the second set input terminal/S2 of the flip-flop 6252.

Figure 10:
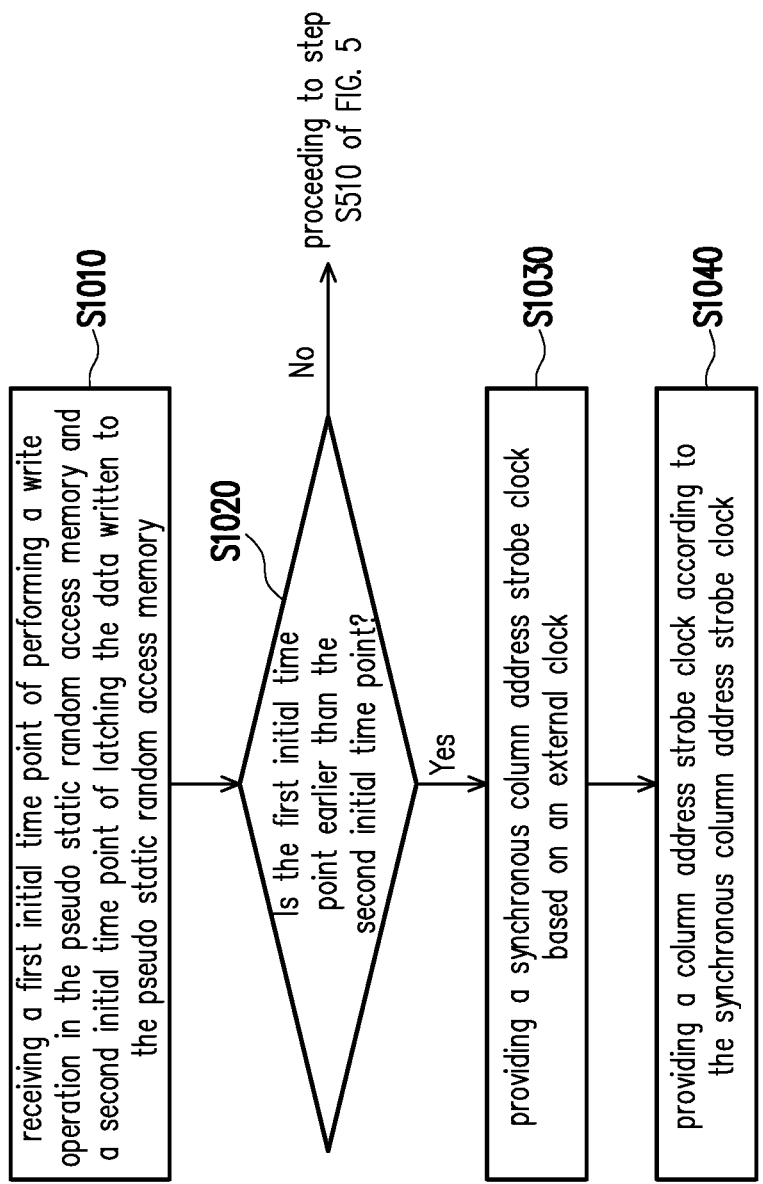
FIG. 10 is a flowchart of a control method according to the second embodiment.

Referring to FIG. 6 and FIG. 10 at the same time, FIG. 10 is a flowchart of a control method according to the second embodiment. In the present embodiment, in step S1010, the control circuit receives a first initial time point of performing a write operation in the pSRAM and a second initial time point of latching the data written to the pSRAM. In step S1020, the control circuit 620 determines whether first initial time point is earlier than the second initial time point of latching the data written to the pSRAM. When it is determined that the first initial time point is earlier than the second initial time point, the control circuit 620 provides a synchronous write indication signal SYNCWR, and proceeding to step S1030. In step S1030, the control circuit 620 provides a synchronous column address strobe clock CASP_S based on an external clock according to the synchronous write indication signal SYNCWR. Next, in step S1040, a column address strobe clock CASP is provided according to the synchronous column address strobe clock CASP_S. The implementation details of steps S1010 to S1040 have been described in the description of the above embodiment and shall not be repeatedly described here. On the other hand, when the control circuit 620 determines in step S1020 that the first initial time point is later than or equal to the second initial time point, the synchronous write indication signal SYNCWR is not provided, and proceeding to step S510 of FIG. 5. After the control circuit 620 proceeds to step S510, the control method of the control circuit 620 will be the same as the control method (steps S510 to S570) of the control circuit 120 of FIG. 1.

In summary of the above, the control circuit and the control method of the disclosure count a number of latch times of the data based on the external clock to generate the first count value, count a number of write times of the data based on the asynchronous column address strobe clock to generate the second count value, and compare the first count value and the second count value. The control circuit and the control method provide the asynchronous column address strobe clock according to the column address strobe clock in the asynchronous mode to provide the column address strobe clock. At the time of the first occurrence of the first count value being equal to the second count value, the control circuit and the control method enter the write operation into the synchronous mode from the asynchronous mode to adjust the period of the asynchronous column address strobe clock to the period of the external clock to provide the column address strobe clock. Accordingly, in the write operation, the disclosure can execute the synchronous mode and the asynchronous mode of the write operation without using multiple control paths. In addition, the control circuit and the control method of the disclosure can further determine whether the time point at which the data starts to be written is earlier than the time point at which the data starts to be latched. If the time point at which the data starts to be written is earlier than the time point at which the data is latched, the control circuit and the control method provide the synchronous column address strobe clock and provide the column address strobe clock according to the synchronous column address strobe clock. Accordingly, the timing at which the data is latched is synchronized with the timing at which the data is written, and the case where the timing at which the data is latched does not catch up with the timing at which the data is written does not occur.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

The disclosure relates a control circuit and a control method for a pSRAM. The control circuit and the control method can support a write operation of the asynchronous mode and a write operation of the synchronous mode.

What is claimed is:

1. A control circuit adapted for a pseudo static random access memory, the control circuit comprising:
    a first counter configured to count a number of latch times of data written to the pseudo static random access memory based on an external clock to generate a first count value;
    a second counter configured to count a number of write times of the data written to the pseudo static random access memory based on an asynchronous column address strobe clock to generate a second count value, wherein an initial period of the asynchronous column address strobe clock is less than a period of the external clock;
    a comparator, coupled to the first counter and the second counter, configured to compare the first count value and the second count value, and provide a mode signal at a first logic level when the first count value is equal to the second count value;
    an asynchronous controller, coupled to the comparator and the second counter, configured to receive the mode signal and a column address strobe clock in a write operation, and provide the asynchronous column address strobe clock according to the column address strobe clock in an asynchronous mode, wherein when receiving the mode signal at the first logic level for a first time, the asynchronous controller enters the write operation into a synchronous mode from the asynchronous mode to adjust the period of the asynchronous column address strobe clock to the period of the external clock; and
    a clock generator, coupled to the asynchronous controller, configured to provide the column address strobe clock according to the asynchronous column address strobe clock.

2. The control circuit according to claim 1, wherein when the first count value is not equal to the second count value, the comparator provides the mode signal at a second logic level, wherein the second logic level is different from the first logic level.

3. The control circuit according to claim 2, wherein when the mode signal at the second logic level is provided, the asynchronous controller starts to provide the asynchronous column address strobe clock when going into the write operation.

4. The control circuit according to claim 1, wherein the asynchronous controller comprises:
    a first timing adjuster, coupled to the clock generator, configured to receive the column address strobe clock, and adjust a time length of a low logic level of the asynchronous column address strobe clock based on the column address strobe clock; and
    an asynchronous determiner, coupled to the first timing adjuster and the clock generator, configured to provide the asynchronous column address strobe clock when receiving the mode signal at the second logic level and a write enable signal corresponding to entering the write operation.

5. The control circuit according to claim 4, wherein the first timing adjuster comprises:
    a first inverter, wherein an input terminal of the first inverter is coupled to the clock generator to receive the column address strobe clock;
    a delayer, wherein an input terminal of the delayer is coupled to an output terminal of the first inverter;
    a NAND gate, wherein a first input terminal of the NAND gate is coupled to the output terminal of the first inverter, and a second input terminal of the NAND gate is coupled to an output terminal of the delayer; and
    a second inverter, wherein an input terminal of the second inverter is coupled to an output terminal of the NAND gate, and an output terminal of the second inverter is coupled to the asynchronous determiner.

6. The control circuit according to claim 1, wherein the clock generator comprises:
    a first inverter, wherein an input terminal of the first inverter is coupled to the asynchronous controller to receive the asynchronous column address strobe clock;
    a flip-flop, wherein a set input terminal of the flip-flop is coupled to an output terminal of the first inverter;
    a first timing adjuster, wherein an input terminal of the first timing adjuster is coupled to an output terminal of the flip-flop, and the first timing adjuster is configured to adjust a time length of a high logic level of the column address strobe clock based on the asynchronous column address strobe clock;
    a second inverter, wherein an input terminal of the second inverter is coupled to an output terminal of the first timing adjuster, and an output terminal of the second inverter is configured to provide the column address strobe clock; and
    a second timing adjuster, wherein an input terminal of the second timing adjuster is coupled to the output terminal of the first timing adjuster, an output terminal of the second timing adjuster is coupled to a reset input terminal of the flip-flop, and the second timing adjuster is configured to adjust a reset timing of the flip-flop based on the asynchronous column address strobe clock.

7. The control circuit according to claim 1, further comprising:
    a synchronous write indicator configured to:
        determine whether a first initial time point of performing the write operation in the pseudo static random access memory is earlier than a second initial time point of latching the data written to the pseudo static random access memory, and provide a synchronous write indication signal when it is determined that the first initial time point is earlier than the second initial time point; and a synchronous controller, coupled to the synchronous write indicator and the clock generator, configured to be enabled according to the synchronous write indication signal to provide a synchronous column address strobe clock based on the external clock.

8. The control circuit according to claim 7, wherein the first counter is disabled according to the synchronous write indication signal to stop providing the first count value, and the second counter is disabled according to the synchronous write indication signal to stop providing the second count value, so that the comparator provides the mode signal at the first logic level.

9. The control circuit according to claim 7, wherein the clock generator is further configured to provide the column address strobe clock according to the synchronous column address strobe clock when the synchronous write indication signal is provided.

10. The control circuit according to claim 7, wherein the clock generator comprises:
   a first inverter, wherein an input terminal of the first inverter is coupled to the asynchronous controller to receive the asynchronous column address strobe clock;
   a flip-flop, wherein a first set input terminal of the flip-flop is coupled to an output terminal of the first inverter;
   a first timing adjuster, wherein an input terminal of the first timing adjuster is coupled to an output terminal of the flip-flop;
   a second inverter, wherein an input terminal of the second inverter is coupled to an output terminal of the first timing adjuster, and an output terminal of the second inverter is configured to provide the column address strobe clock;
   a second timing adjuster, wherein an input terminal of the second timing adjuster is coupled to the output terminal of the first timing adjuster, an output terminal of the second timing adjuster is coupled to a reset input terminal of the flip-flop, and the second timing adjuster is configured to adjust a reset timing of the flip-flop based on the asynchronous column address strobe clock; and
   a third timing adjuster, wherein an input terminal of the third timing adjuster is coupled to the synchronous controller to receive the synchronous column address strobe clock, and an output terminal of the third timing adjuster is coupled to a second set input terminal of the flip-flop.

11. A control method adapted for a pseudo static random access memory, the control method comprising:
   counting a number of latch times of data written to the pseudo static random access memory based on an external clock to generate a first count value;
   providing the asynchronous column address strobe clock according to the column address strobe clock in an asynchronous mode;
   counting a number of write times of the data written to the pseudo static random access memory based on the asynchronous column address strobe clock to generate a second count value, wherein an initial period of the asynchronous column address strobe clock is less than a period of the external clock;
   comparing the first count value and the second count value, and providing a mode signal at a first logic level when the first count value is equal to the second count value;

entering a write operation into a synchronous mode from the asynchronous mode according to the mode signal at the first logic level provided for a first time to adjust the period of the asynchronous column address strobe clock to the period of the external clock; and providing the column address strobe clock according to the asynchronous column address strobe clock.

12. The control method according to claim 11, wherein the step of comparing the first count value and the second count value comprises:
   when the first count value is not equal to the second count value, providing the mode signal at a second logic level,
   wherein the second logic level is different from the first logic level.

13. The control method according to claim 12, further comprising:
   when the mode signal at the second logic level is provided, starting to provide the asynchronous column address strobe clock when going into the write operation.

14. The control method according to claim 11, wherein the step of providing the asynchronous column address strobe clock according to the column address strobe clock in the asynchronous mode comprises:
   receiving the column address strobe clock, and adjusting a time length of a low logic level of the asynchronous column address strobe clock based on the column address strobe clock; and
   providing the asynchronous column address strobe clock when receiving the mode signal at the second logic level and a write enable signal corresponding to entering the write operation.

15. The control method according to claim 11, wherein the step of providing the column address strobe clock according to the asynchronous column address strobe clock comprises:
   adjusting a time length of a high logic level of the column address strobe clock based on the asynchronous column address strobe clock.

16. The control method according to claim 11, further comprising:
   determining whether a first initial time point of performing the write operation in the pseudo static random access memory is earlier than a second initial time point of latching the data written to the pseudo static random access memory;
   providing a synchronous write indication signal when it is determined that the first initial time point is earlier than the second initial time point; and
   providing a synchronous column address strobe clock based on the external clock according to the synchronous write indication signal.

17. The control method according to claim 16, further comprising:
   stopping providing the first count value according to the synchronous write indication signal and stopping providing the second count value according to the synchronous write indication signal so as to provide the mode signal at the first logic level.

18. The control method according to claim 16, further comprising:
   providing the column address strobe clock according to the synchronous column address strobe clock when the synchronous write indication signal is provided.

* * * * *